(12) United States Patent
Huang et al.

(10) Patent No.: US 6,586,324 B2
(45) Date of Patent: Jul. 1, 2003

(54) METHOD OF FORMING INTERCONNECTS

(75) Inventors: Tse-Yao Huang, Taipei (TW); Chih-Ching Lin, Taoyuan (TW); Yu-Chi Sun, Pingjen (TW); Chang Rong Wu, Banchiau (TW); Shing-Yih Shih, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/057,085

(22) Filed: Jan. 25, 2002

(65) Prior Publication Data

US 2003/0082899 A1 May 1, 2003

(30) Foreign Application Priority Data

Oct. 26, 2001 (TW) ........................ 90126529 A

(51) Int. Cl.$^7$ .................... H01L 21/4763; H01L 21/302
(52) U.S. Cl. .................. 438/618; 438/689; 438/706; 438/712; 438/713; 438/714; 438/724
(58) Field of Search ................. 438/618, 689, 438/706, 712, 713, 714, 717, 723, 724, 734, 738, 743, 744

(56) References Cited

U.S. PATENT DOCUMENTS

| | | | | |
|---|---|---|---|---|
| 5,534,107 A | * | 7/1996 | Gray et al. | ............... 156/643.1 |
| 6,117,345 A | * | 9/2000 | Liu et al. | ....................... 216/19 |
| 6,177,331 B1 | * | 1/2001 | Koga | ......................... 438/424 |
| 6,225,217 B1 | * | 5/2001 | Usami et al. | ............... 438/637 |
| 6,274,498 B1 | * | 8/2001 | Moore et al. | ............... 438/692 |
| 6,281,051 B1 | * | 8/2001 | Tsutsumi | .................... 438/142 |

\* cited by examiner

*Primary Examiner*—Kamand Cuneo
*Assistant Examiner*—Scott B. Geyer
(74) *Attorney, Agent, or Firm*—Ladas & Parry

(57) ABSTRACT

A method of forming interconnects. An oxide masking layer with patterns is formed overlaying the metal layer. The patterns of the masking layer are transferred into the metal layer so as to form an opening. Then, a silicon nitride liner is conformally formed on the masking layer, the metal layer and the first insulating layer. Next, the silicon nitride liner and the masking layer are partially removed by reactive ion etching to leave a facet mask to reduce the aspect ratio of the opening followed by removal of the remaining silicon nitride liner. Then, an insulating layer is deposited to fill the opening.

17 Claims, 3 Drawing Sheets

METHOD OF FORMING INTERCONNECTS

BACKGROUND OF THE INVENTION

1. Field of the Invention

The present invention relates to the manufacture of semiconductor devices, more particularly to a method of forming interconnects to reduce the aspect ratio of an opening and improve gap fill capability during the subsequent deposition of an insulating layer.

2. Description of the Related Art

Current integrated circuit manufacturing processes typically use multiple levels of some form of metal interconnect to provide interconnections between various circuits on the integrated circuit. For instance, current manufacturing processes are known to use five levels of metal interconnects. The etching process to form the interconnect requires that precisely defined regions of metal be exposed to etchants in order to selectively remove material from those regions. The patterns that define the regions are typically created using lithographic processes. For instance, a layer of photoresist is spin-coated onto a substrate, and the resist layer is selectively exposed to a form of radiation, such as ultraviolet light, electrons, or x-rays.

An exposure tool and mask, or data tape in electron beam lithography, are used to effect the desired selective exposure. Openings in the resist corresponding to the selective exposure are formed in a subsequent development step. Next, an etching step is applied, and the regions of the substrate exposed by the openings are removed. The etching provides a desired pattern in the metal layer to form the final usable interconnect.

The process limitations are compounded by poor selectivity between metal such as aluminum, and photoresist during a typical metal etching process. As the photoresist becomes thicker, the openings near the bottom surface tend to narrow. As a result, thicker photoresist tends to limit the resolution. As the thickness of metal film is increased, thicker and thicker photoresist must be used in order to provide enough process margin during the etching step. That is, in order to prevent excessive metal erosion during the etching step, sufficient photoresist must be left over protected metal areas during the metal etch portion of the process. However, as resists become thicker, it becomes harder to resolve smaller features with an acceptable depth of focus.

Therefore, generally speaking, the resolution is improved by thinning the photoresist. That is, thinner resist allows the extension of standard exposure tools to finer geometries. However, the photoresist must remain thick enough to avoid metal being eroded by the etchant. For instance, for submicron patterns, the photoresist might be approximately 2 to 3 times as thick as an underlying metal layer in order to adequately protect the metal layer from an etchant that is particularly harsh to the photoresist. Unfortunately, at this thickness, the resolution of the photoresist may produce significant deviations between the desired pattern and the actual pattern transferred to the substrate.

Accordingly, there exists a need for an efficient method of patterning metal layers forming interconnects using a thin layer of photoresist while adequately protecting the metal film from the etching step. To meet the requirements, an oxide hard mask has been used to replace the thick photoresist on the aluminum layer, having an oxide layer thereunder, as the etching mask during etch of aluminum.

However, the gap fill capability during the subsequent deposition of an insulating layer is insufficient because an aspect ratio of the opening between the stacked structures consisting of the etched aluminum interconnect and the remaining oxide mask becomes approximately 3 to 4.

SUMMARY OF THE INVENTION

In view of the above disadvantages, an object of the invention is to provide a method of forming interconnects to reduce the aspect ratio of an opening by the formation of a facet mask. As a result, the gap fill capability during the subsequent deposition of an insulating layer can be improved.

Accordingly, the above object is attained by providing a method of forming interconnects. It is suitable for a semiconductor substrate with a first insulating layer thereon. First, a metal layer is provided on the first insulating layer followed by the formation of a masking layer with patterns overlaying the metal layer. Second, the patterns of the masking layer are transferred into the metal layer so as to form an opening by an etching step.

Then, silicon nitride liner is conformally formed on the surfaces of the masking layer, the metal layer and the first insulating layer. Third, the silicon nitride liner and the masking layer are partially removed by reactive ion etching to leave a facet mask with high etch selectivity of the silicon nitride liner at the corner with respect to the bottom to reduce the aspect ratio of the opening. That is, the etching rate of the silicon nitride liner at the corner is higher than that at the bottom. Fourth, the remaining silicon nitride liner is removed to expose the first insulating layer. Then, a second insulating layer is deposited to fill the opening.

In an embodiment of the invention, the metal layer is preferably an aluminum layer, and the masking layer is composed of silicon oxide.

Moreover, in another embodiment of the invention, the silicon nitride liner and the masking layer are removed by reactive ion etching using the mixture gas of argon gas and carbon fluoride such as at least one $CHF_3$, $CH_3F$, $CH_2F_2$, $CF_4$, $C_4F_6$, $C_4F_8$, or $C_5F_8$. Preferably, at least one oxygen-containing gas such as CO or $O_2$ is introduced into the mixture gas. Furthermore, in the method of forming interconnects, the silicon nitride liner and the masking layer are preferably removed at a pressure of about 3 mtorr to 100 mtorr with power of about 500 W to 2000 W.

The above object is also attained by providing a method of forming interconnects. It is suitable for a semiconductor substrate with a first silicon oxide layer thereon. First, a metal layer is provided on the first silicon oxide layer followed by the formation of a silicon oxide masking layer with patterns overlaying the metal layer. Second, the patterns of the silicon oxide masking layer are transferred into the metal layer so as to form an opening.

Third, a silicon nitride liner is conformally formed on the surfaces of the silicon oxide masking layer, the metal layer and the first silicon oxide layer. Fourth, the silicon nitride liner and the masking layer are partially removed by reactive ion etching to leave a facet mask, wherein the silicon nitride liner at the corner has an etch selectivity of 10 to 20 with respect to the silicon oxide masking layer, the silicon nitride liner at the bottom has an etch selectivity of about 50 with respect to the first silicon oxide layer to reduce the aspect ratio of the opening. Thereafter, the remaining silicon nitride liner is removed. Next, a second silicon oxide layer is deposited to fill the opening with a lower aspect ratio.

BRIEF DESCRIPTION OF THE DRAWINGS

The preferred embodiment of the invention is hereinafter described with reference to the accompanying drawings in which.

DETAILED DESCRIPTION OF THE PREFERRED EMBODIMENTS

FIG. 1A to FIG. 1E are cross-sections showing the manufacturing steps of interconnects, according to the invention.

Figure 1A:
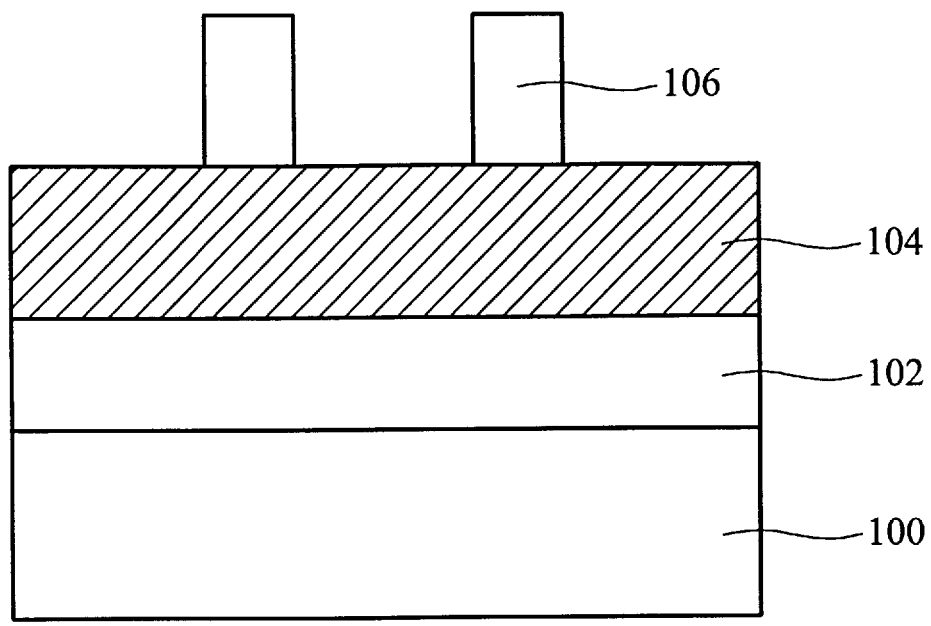
FIGS. 1A to 1E are cross-sections showing the manufacturing steps of interconnects on a semiconductor substrate, in accordance with the preferred embodiment of the invention.

As shown in FIG. 1A, a semiconductor substrate 100, having a variety of semiconductor devices such as resistors, conductors and transistors (for clarity, not shown), is provided. An insulating layer 102, serving as inter-layer dielectric (ILD), or inter-metal dielectric (IMD) is formed on the semiconductor substrate 100. The insulating layer 102 is typically composed of silicon oxide. Next, a metal layer 104 such as an aluminum layer is formed over the insulating layer 102. Then, a masking layer 106 with patterns of conductive lines is defined on the metal layer 104 by a conventional photolithography process and an etching step. The masking layer is preferably a silicon oxide layer deposited by chemical vapordeposition (CVD) using tetra-ethyl-ortho-silicate (TEOS) as the main reactive gas.

Figure 1B:
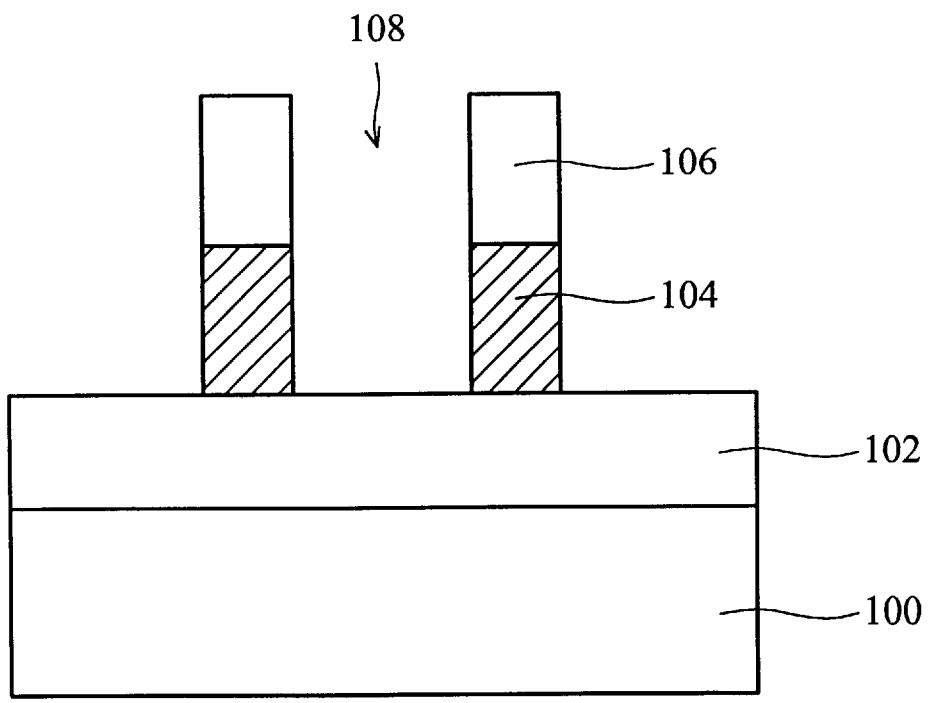

Referring to FIG. 1B, the patterns of the masking layer 106 are transferred into the metal layer 104 by means of a conventional etching step to create an opening 108 through the masking layer 106 and the metal layer 104. Also, the opening 108 is etched until the insulating layer 102 is exposed.

Figure 1C:
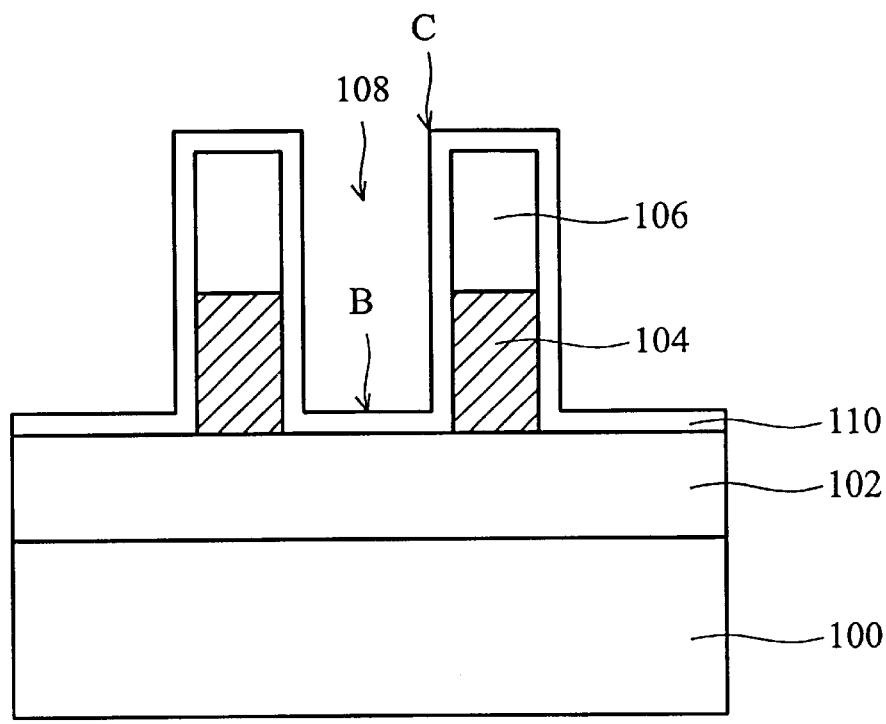

Next, referring to FIG. 1C, a conformal silicon nitride liner 110 is deposited on the surfaces of the masking layer 106, metal layer 104, and the insulating layer 102 by chemical vapor deposition. This silicon nitride liner 110 protects the insulating layer 102 from damage during etching.

Figure 1D:
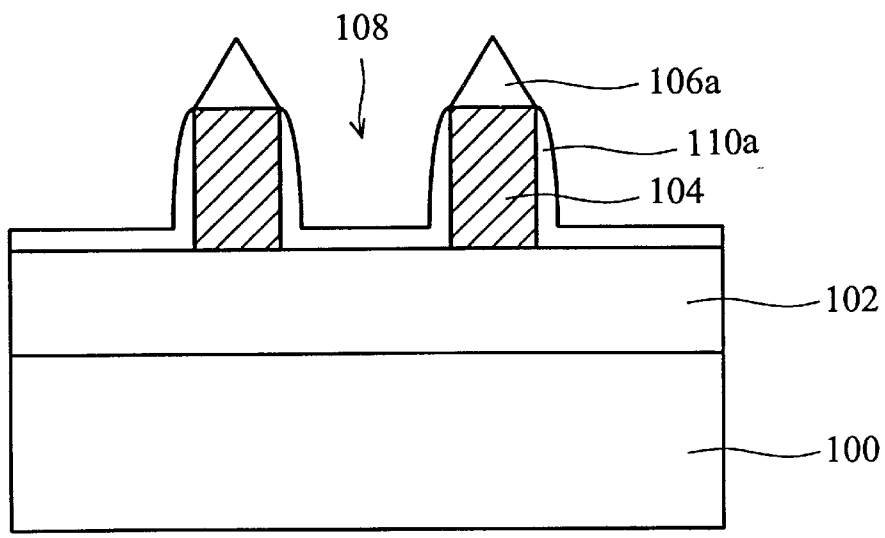

Afterward, as shown in FIG. 1D, the masking layer 106 and the silicon nitride liner 110 are partially removed by reactive ion etching (RIE) with a higher etching rate at the corner C of the silicon nitride liner 110 with respect to the bottom B, near the bottom of the opening 108, of the silicon nitride liner 110 to leave a facet mask 106a and a silicon nitride liner 110a. As a result, the height (the aspect ratio) of the opening 108 can be reduced.

A reactive ion etching system is used so that the silicon nitride liner 110 at the corner C has an etch selectivity of 10 to 20 with respect to the silicon oxide masking layer 106. On the other hand, the silicon nitride liner 110 at the bottom B has an etch selectivity of about 50 with respect to the oxide insulating layer 102. The reactive ion etching system (etchant) described above includes a mixture gas consisting of argon and at least one carbon fluoride such as CHF3, CH3F, CH2F2, CF4, C4F6, C4F8, or C5F8. Furthermore, at least one oxygen-containing gas such as CO or O2 is preferably introduced into the reactive ion etching system at a pressure of about 3 mtorr to 100 mtorr. Moreover, power of about 500 W to 2000 W is applied to the etching system.

Figure 1E:
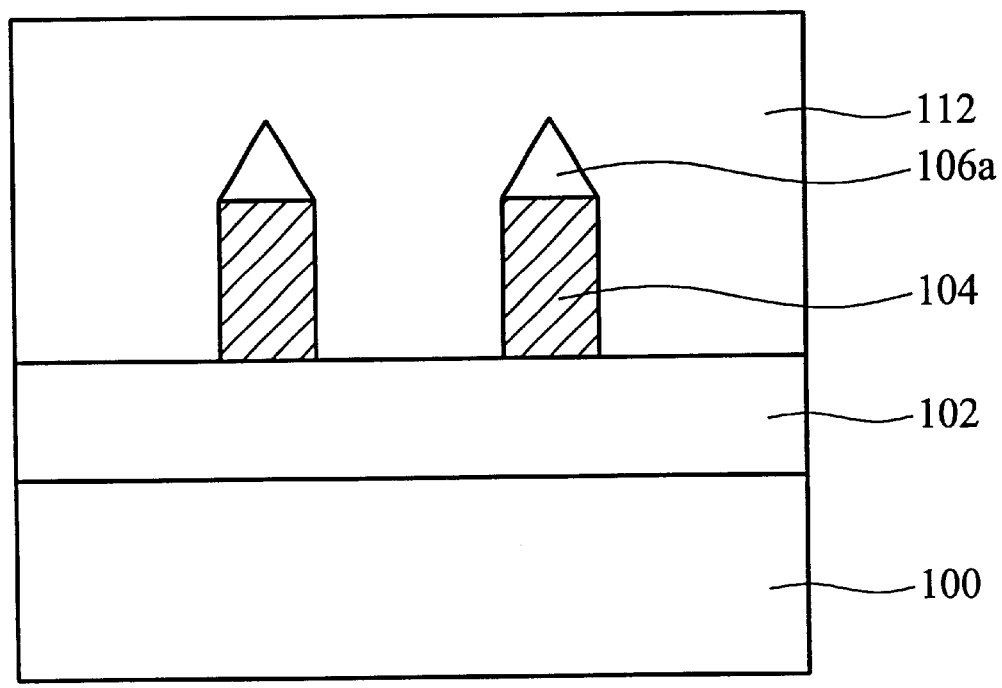

Next, as shown in FIG. 1E, the remaining silicon nitride liner 110a is removed followed by deposition of an insulating layer 112 composed of silicon oxide to fill the opening 108. In this embodiment, the facet mask 106a is formed to reduce the aspect ratio of the opening 108. Therefore, the gap fill insulating layer 112 is easily deposited into the opening 108.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the scope of the invention defined by the following claims and their equivalents.

What is claimed is:

1. A method of forming interconnects, suitable for a semiconductor substrate with a first insulating layer thereon, comprising the steps of:

providing a metal layer on the first insulating layer;

forming a masking layer with patterns overlaying the metal layer;

transferring the patterns of the masking layer into the metal layer so as to form an opening;

conformally forming a silicon nitride liner on the surfaces of the masking layer, the metal layer and the first insulating layer;

partially removing the silicon nitride liner and the masking layer by reactive ion etching to leave a facet mask with high etch selectivity of the silicon nitride liner at the corner with respect to the bottom to reduce the aspect ratio of the opening;

removing the silicon nitride liner; and forming a second insulating layer to fill the opening.

2. A method of forming interconnects as claimed in claim 1, wherein the metal layer is an aluminum layer.

3. A method of forming interconnects as claimed in claim 1, wherein the masking layer is silicon oxide.

4. A method of forming interconnects as claimed in claim 1, wherein the silicon nitride liner and the masking layer are removed by reactive ion etching using the mixture gas of argon gas and carbon fluoride, wherein carbon fluoride comprises $CHF_3$, $CH_3F$, $CH_2F_2$, $CF_4$, $C_4F_6$, $C_4F_8$, or $C_5F_8$.

5. A method of forming interconnects as claimed in claim 4, wherein the reactive gas further comprises an oxygen-containing gas, wherein the oxygen-containing gas comprises CO or O2.

6. A method of forming interconnects as claimed in claim 5, wherein the silicon nitride liner and the masking layer are removed at a pressure of about 3 mtorr to 100 mtorr with power of about 500 W to 2000 W.

7. A method of forming interconnects, suitable for a semiconductor substrate with a first silicon oxide layer thereon, comprising the steps of:

providing a metal layer on the first silicon oxide layer;

forming a silicon oxide masking layer with patterns overlaying the metal layer;

transferring the patterns of the silicon oxide masking layer into the metal layer so as to form an opening;

conformally forming a silicon nitride liner on the surfaces of the silicon oxide masking layer, the metal layer and the first silicon oxide layer;

partially removing the silicon nitride liner and the masking layer by reactive ion etching to leave a facet mask, wherein the silicon nitride liner at the corner has an etch selectivity of 10 to 20 with respect to the silicon oxide masking layer, and the silicon nitride liner at the bottom has an etch selectivity of 50 with respect to the first silicon oxide layer to reduce the aspect ratio of the opening;

removing the silicon nitride liner; and forming a second silicon oxide layer to fill the opening.

8. A method of forming interconnects as claimed in claim 7, wherein the metal layer is an aluminum layer.

9. A method of forming interconnects as claimed in claim 7, wherein the silicon nitride liner and the masking layer are removed by reactive ion etching using the mixture gas of argon gas and carbon fluoride, wherein carbon fluoride comprises $CHF_3$, $CH_3F$, $CH_2F_2$, $CF_4$, $C_4F_6$, $C_4F_8$, or $C_5F_8$.

10. A method of forming interconnects as claimed in claim 9, wherein the reactive gas further comprises an oxygen-containing gas, wherein the oxygen-containing gas comprises CO or O2.

11. A method of forming interconnects as claimed in claim 10, wherein the silicon nitride liner and the silicon oxide masking layer are removed at a pressure of about 3 mtorr to 100 mtorr with power of about 500 W to 2000 W.

12. A method of forming interconnects, suitable for a semiconductor substrate with a first insulating layer thereon, comprising the steps of:

providing a metal layer on the first insulating layer;

forming a masking layer with patterns overlaying the metal layer;

transferring the patterns of the masking layer into the metal layer so as to form an opening;

conformally forming a silicon nitride liner on the surfaces of the masking layer, the metal layer and the first insulating layer;

partially removing the silicon nitride liner and the masking layer by reactive ion etching to leave a facet mask with high etch selectivity of the silicon nitride liner at the corner with respect to the bottom to reduce the aspect ratio of the opening;

removing the remaining silicon nitride liner in the opening to expose sidewalls of the metal layer and the surface of the first insulating layer; and forming a second insulating layer to cover the metal layer and the first insulating layer and fill the opening.

13. A method of forming interconnects as claimed in claim 12, wherein the metal layer is aluminum.

14. A method of forming interconnects as claimed in claim 12, wherein the masking layer is silicon oxide.

15. A method of forming interconnects as claimed in claim 12, wherein the silicon nitride liner and the masking layer are removed by reactive ion etching using the mixture gas of argon gas and carbon fluoride, wherein carbon fluoride comprises $CHF_3$, $CH_3F$, $CH_2F_2$, $CF_4$, $C_4F_6$, $C_4F_8$, or $C_5F_8$.

16. A method of forming interconnects as claimed in claim 15, wherein the reactive gas further comprises an oxygen-containing gas, the oxygen-containing gas comprising CO or O2.

17. A method of forming interconnects as claimed in claim 16, wherein the silicon nitride liner and the masking layer are removed at a pressure of about 3 mtorr to 100 mtorr with power of about 500 W to 2000 W.

* * * * *